United States Patent [19]

Isohata et al.

[11] Patent Number: 4,496,239
[45] Date of Patent: Jan. 29, 1985

[54] PROJECTION EXPOSURE APPARATUS

[75] Inventors: Junji Isohata; Mitsuya Sato, both of Tokyo, Japan

[73] Assignee: Canon Kabushiki Kaisha, Tokyo, Japan

[21] Appl. No.: 440,429

[22] Filed: Nov. 9, 1982

[30] Foreign Application Priority Data

Dec. 29, 1981 [JP] Japan .................................. 56-215336

[51] Int. Cl.³ ........................ G03B 27/52; G03B 27/42; G03B 27/32
[52] U.S. Cl. ......................................... 355/30; 355/53; 355/77
[58] Field of Search ....................... 355/30, 53, 77, 51; 384/122; 136/203

[56] References Cited

U.S. PATENT DOCUMENTS

| | | | |
|---|---|---|---|
| 3,648,470 | 3/1972 | Schulte | 136/203 X |
| 4,202,623 | 3/1980 | Watkin | 355/30 |
| 4,215,934 | 8/1980 | Karasawa et al. | 355/51 |
| 4,226,483 | 10/1980 | Yamamoto | 384/122 |
| 4,370,054 | 1/1983 | Isohata et al. | 355/53 |

Primary Examiner—L. T. Hix
Assistant Examiner—Douglas S. Lee
Attorney, Agent, or Firm—Fitzpatrick, Cella, Harper & Scinto

[57] ABSTRACT

Disclosed is an apparatus for exposing a wafer to a projected image of a mask, and including a mask holder for holding the mask, a wafer holder for holding the wafer, a projection optical system for projecting the image of the mask upon the wafer, a guide path extending along a scanning direction, a plurality of sliders sliding on the guide path, a movable member coupling the mask holder and the wafer holder and placed on the sliders, a heater for compensating for the magnification error of the image in a direction orthogonal to the scanning direction attributable to the projection optical system and for producing a temperature distribution in one of the mask and the wafer, and a controller for compensating for the magnification error of the image in the scanning direction and the error of right angle attributable to the guide path and for controlling the posture of the movable member during the movement thereof.

8 Claims, 10 Drawing Figures

PROJECTION EXPOSURE APPARATUS

BACKGROUND OF THE INVENTION

1. Field of the Invention

This invention relates to an apparatus for precisely transferring a negative to a photosensitive member, and more particularly relates to an apparatus which effects the transfer by scanning a wafer with a semiconductor integrated circuit pattern image.

2. Description of the Prior Art

In the field of semiconductor elements, there is a tendency to more minute patterns and higher integration, such as IC, LSI and super-LSI, and therefore higher accuracy and higher quality have been required of printing apparatus.

Important factors required of the printing apparatus will hereinafter be described.

(a) Printing performance for enabling minute patterns of the order of 1–2 m to be printed.

(b) Positioning accuracy necessary for accurately positioning a pattern of a photomask of the next step relative to the pattern on a wafer which has been printed by the photomask of the preceding step.

As an apparatus which satisfies the above-mentioned requirements, there is known one in which the slit image of a photomask is projected upon a wafer by means of a reflecting optical system, comprising combined concave and convex mirrors, and in which the photomask and the wafer are moved together with each other for the whole surface exposure of the wafer. In this apparatus, it is important to move the photomask and wafer smoothly, and a construction for realizing this is described in U.S. Pat. No. 4,215,934. Also, an air bearing system for placing a movable portion thereon to ensure highly accurate movement is described in U.S. Pat. No. 4,215,934.

In FIG. 10 of the accompanying drawings, reference numeral 31 designates a mask illuminating system which comprises, in the direction of the optical axis, a condensing mirror 33, a mercury lamp 34, a first condenser lens 35, a filter 32, a mirror 36, a second condenser lens 37 and a light-intercepting plate 38 having an arcuate slit. The filter 32 is inserted during alignment to cut off the light of sensitizing wavelength range. Reference numeral 39 designates a photomask having an integrated circuit pattern, and reference numeral 21 denotes a photosensitive wafer. Reference numerals 41 and 42 designate mirrors for bending the optical path, reference numeral 44 denotes a concave mirror, and reference numeral 43 designates a convex mirror. These mirrors together constitute a one-to-one-magnification reflecting optical system. Designated by 46 is an alignment scope through which the photomask 39 and the wafer 21 are observed for alignment. The alignment scope 46 is inserted into the illuminating light path during alignment.

In the above-described apparatus, during the exposure, the photomask 39 and the wafer 21 are moved together in the direction of the arrows, and distortion is often created in the pattern image transferred to the wafer 21. This is, in some cases, due to the distortion created in the wafer itself when it was chemically treated in the preceding step, or, in other cases, to the distortion created during transfer.

The direction in which the transfer error occurs will be described with reference to FIG. 9 of the accompanying drawings.

In FIG. 9, reference numeral 21 designates a wafer and reference numeral 22 indicates a magnification error in the X direction. Reference numeral 23 indicates a magnification error in the Y direction, and reference numeral 24 indicates a right angle error. It is to be understood that the Y direction is the direction in which the photomask and the wafer 21 are moved and the X direction is a direction orthogonal thereto. Letter S designates an arcuate slit, namely, a mask illuminating area.

The transfer error in a projection exposure apparatus, in the X direction, is attributable to manufacturing error in the projection optical system, for example, the machining accuracy of the spherical mirror, while, in the Y direction, it is determined by the guide accuracy of a fluid bearing for moving the photomask and the wafer together relative to the imaging optical system. The right angle error is caused by the difference in degree of parallelism between the optical axis of the imaging optical system and the movement axis of the fluid bearing. As described above, the transfer error in the prior art is determined chiefly by the machining accuracy and the assembly accuracy. Therefore, the machining accuracy and assembly accuracy must be very high, and if a variation with time occurs the correction thereof is quite difficult.

SUMMARY OF THE INVENTION

It is an object of the present invention to ensure accurate transfer of the image of a mask to a photosensitive member.

It is another object of the present invention to compensate for the magnification error in the X direction, namely, the distortion of the image attributable to the projection optical system, and also to compensate for the magnification error in the Y direction, namely, the distortion of the image attributable to the guide device.

It is still another object of the present invention to compensate for a right angle error caused by the guide device.

The invention will become fully apparent from the following detailed description thereof taken in conjunction with the accompanying drawings.

DESCRIPTION OF THE PREFERRED EMBODIMENT

Figure 1:
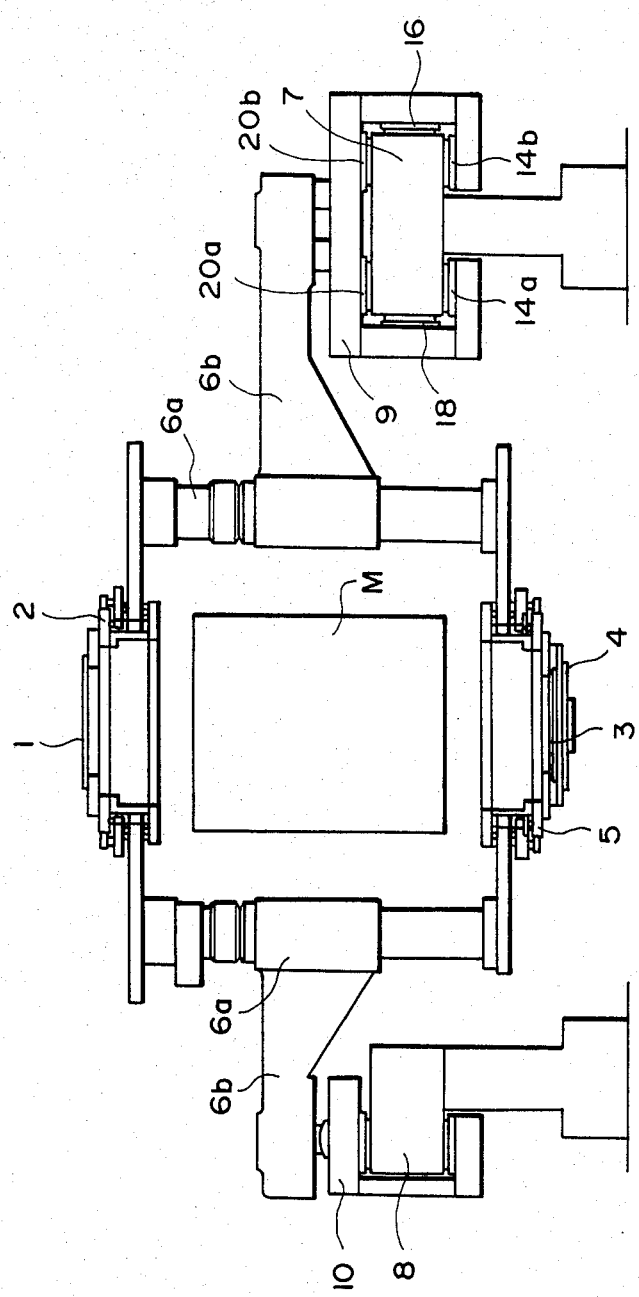
FIG. 1 is a front view showing an embodiment of the present invention.

Referring to FIG. 1, letter M designates a barrel in which a reflecting optical system is contained. Reference numeral 1 denotes a photomask and reference numeral 2 designates a mask stage. The mask stage 2 comprises a chuck for holding the mask 1 and a carriage for moving the chuck in a plane and in a rotational direction. Reference numeral 3 designates a wafer, reference numeral 4 denotes a wafer chuck and reference numeral 5 designates a carriage for moving the wafer chuck 4 in a plane and in a rotational direction. The wafer chuck 4 is designed for temperature control and the details thereof will later be described with reference to FIG. 2.

Denoted by 6a are connecting struts for connecting the mask stage 2 and the carriage 5 integrally to each other. Denoted by 6b are beams firmly coupled to the struts 6a, respectively. Reference numerals 7 and 8 designate guide rails extending in a direction perpendicular to the plane of the drawing sheet. Designated by 9 is a slide bearing engaged with the guide rail 7. The slide bearing 9 supports the movable body comprising the elements 1-6b and controls the horizontal posture and the vertical posture thereof. Denoted by 10 is another slide bearing which is engaged with the guide rail 8 and also supports the movable body. The slide bearings 9 and 10 are firmly coupled to the beam 6b.

Reference characters 14a, 14b, 20a and 20b designate fluid pads, the details of which are disclosed in U.S. Pat. No. 4,226,483. The sets of fluid pads 14a, 14b and 20a, 20b are connected to an air pump (not shown) and the air pressures thereof are controlled independently. Reference numerals 16 and 18 also designate fluid pads which are also connected to the air pump.

In the above-described construction, the movable body 1-6a is supported by air pressure and therefore will very easily be moved if a force in a direction perpendicular to the plane of the drawing sheet is applied thereto by a driver (not shown).

On the other hand, it is known to heat or cool the wafer to correct any distortion created in the wafer. With such temperature control process, however, X direction, Y direction or right angle errors could not be controlled, though the correction of magnification errors with respect to a point is possible.

Figure 2:
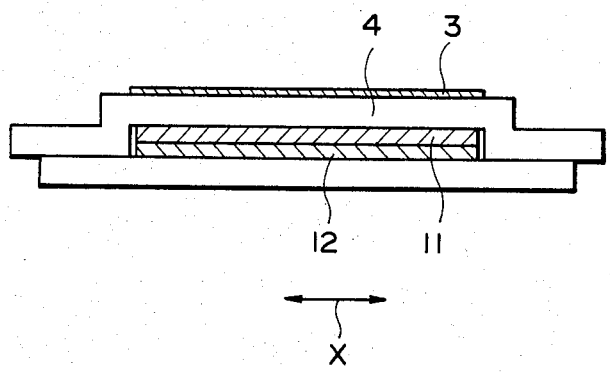
FIG. 2 is a cross-sectional view showing a wafer chuck.

Reference is now had to FIG. 2 to describe the magnification error correction in the X direction. The wafer 3 and wafer chuck 4 are those shown in FIG. 1, and a temperature controlling portion 11 and a heat insulation material 12 are contained in the wafer chuck 4. The temperature controlling portion 11 comprises a heater or a Peltier element group which extends in two-dimensional directions and which is capable of temperature control at each small zone and suitable for forming a desired temperature distribution. When distortion is created in the wafer in the chemical treatment process, a two-dimensional temperature distribution may be formed to correct the distortion, but in the present invention, a temperature distribution can be imparted to the wafer to expand or contract the wafer in advance with the magnification error in the X direction by the projection optical system being taken into account. Thereby, the distortion of the projected image in X direction is cancelled. Also, the mask stage 2 can be provided with a similar temperature controlling portion to deform the mask. The details of the temperature controlling means are described in U.S. application Ser. No. 366,070 of the assignee of the present invention.

On the other hand, the magnification error in the Y direction and the right angle error can be compensated for by controlling the air pressure imparted to a fully restrained (restrained in movement in horizontal and vertical directions) air bearing during the movement thereof.

Figure 3:
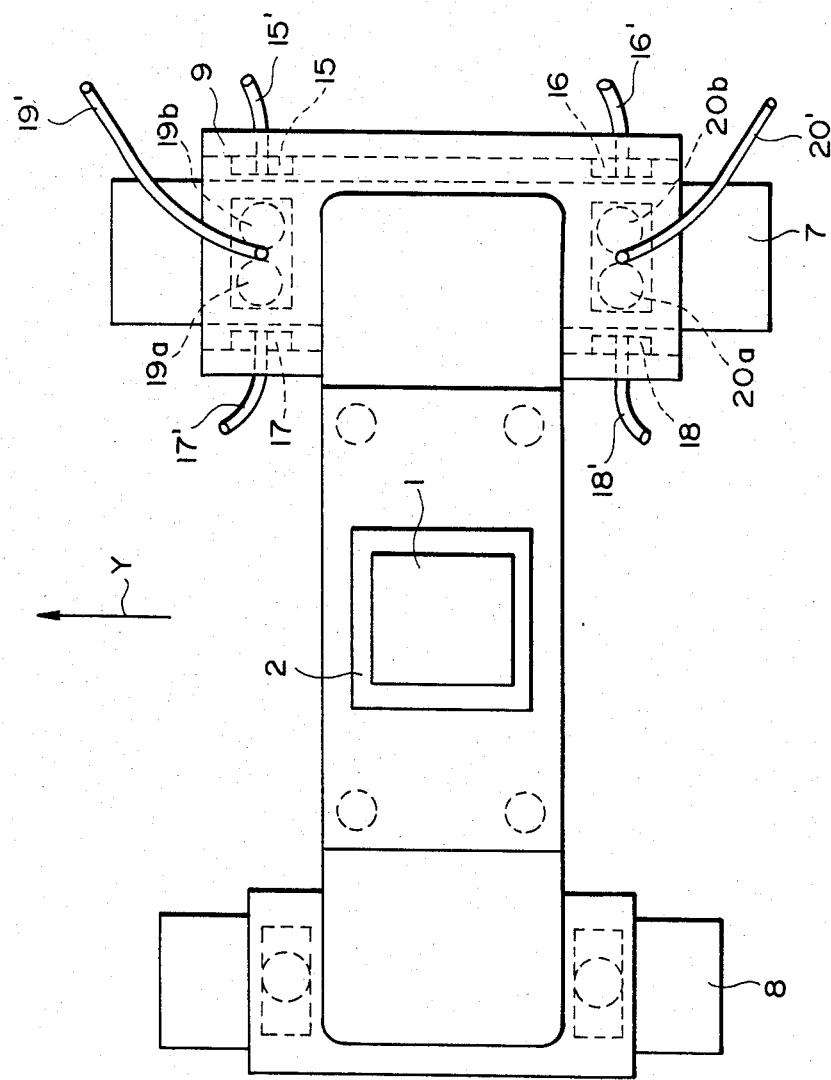
FIG. 3 is a top view of the apparatus of the embodiment shown in FIG. 1.

FIG. 3 depicts the apparatus of FIG. 1 as viewed from above. In FIG. 3, reference numerals 15 and 17 designate fluid pads having a horizontal supporting function. The fluid pad 15, together with the pad 16, is closely spaced apart from the right side surface of the guide rail 7, and the pad 17, together with the pad 18, is spaced apart from the left side surface of the guide rail 7. Designated by 19a and 19b are fluid pads having a vertical supporting function. The pads 19a and 19b, together with pads 20a and 20b, are spaced apart from the upper surface of the guide rail 7.

Designated by 15', 16', 17', 18', 19' and 20' are flexible pipes used to supply compressed air. These pipes communicate with air supply devices whose pressure can be set independently, and the air pressure of each pad is controlled independently.

Figure 4:
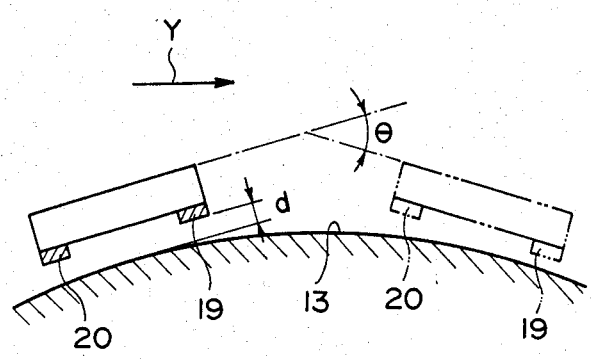
FIG. 4 is a view for illustrating the problems peculiar to the guide device of the prior art.

Problems peculiar to the prior art will now be described by reference to FIG. 4. In FIG. 4, reference numeral 13 designates the upper surface of the guide rail which is depicted with the poor planarity thereof exaggerated. For example, assuming that the upper surface of the guide rail is of an upwardly convex shape and if a constant air pressure is supplied to the pads 19 and 20, the pads 19 and 20 are spaced apart by d from the upper surface of the guide rail. Accordingly, if the air bearing is moved in Y direction, the upper surface of the air bearing fluctuates by an angle of depression or elevation of $\theta°$ with the movement of the air bearing.

The optical axis of the reflecting optical system is fixed while, on the other hand, the mask and the wafer are made integral with each other with a spacing l therebetween and are moved across the optical axis of the reflecting optical system. When, at this time, the movable body holding the mask and wafer is inclined by $\theta°$, a magnification error of $l \tan \theta°$ occurs after all.

Figure 5:
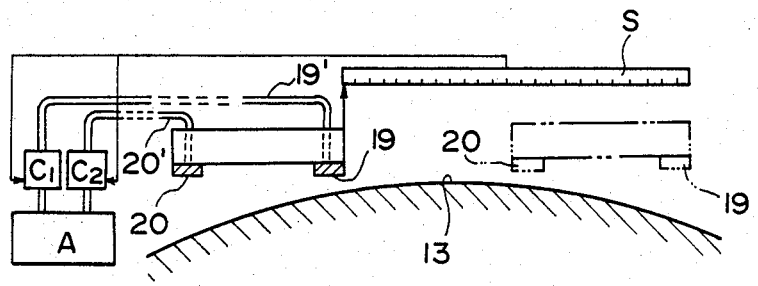
FIGS. 5 and 6 are views for illustrating the operation of the embodiment.

According to the present embodiment, as shown in FIG. 5, a normal pressure is supplied to the front pad 19 while a high pressure is supplied to the rear pad 20 at the starting point of the movement. With the movement of the air bearing, the pressure to the front pad 19 is increased while the pressure to the rear pad 20 is decreased. The concavo-concavity of the upper surface of the guide rail 13 can be measured in advance and therefore, the position of the air bearing is accurately measured by a distance measuring device S, and the pressures to be applied to the pads 19 and 20 at the detected position are determined. Accordingly, by regulating the amounts of air to be supplied from the air pump A to the air supply pipes 19' and 20', with pressure controllers C1 and C2, respectively, air at a predetermined pressure is supplied to each pad 19 or 20 at all positions during movement. A controlled pressure is likewise imparted to each of the other pads. The method of precisely controlling the pressure to be imparted to each pad is fully described in U.S. Pat. No. 4,370,054 of the assignee of the present invention.

Figure 6:
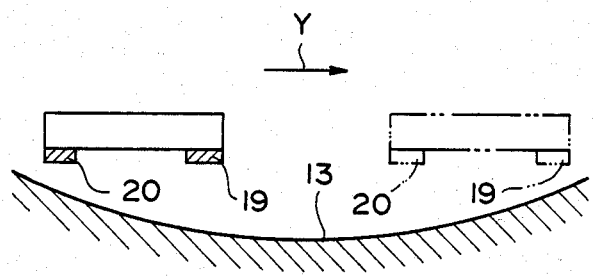

In case the guide is of a concavely curved shape as shown in FIG. 6, the pressure supplied to the rear pad and the pressure supplied to the front pad may be decreased and increased, respectively, at the movement starting position, and the pressure supplied to the rear pad and the pressure supplied to the front pad may be increased and decreased, respectively, with the movement. In case the guide is of a concavo-convex shape, the controls in FIGS. 5 and 6 may be effected alternately.

The right angle error will now be described.

Figure 7:
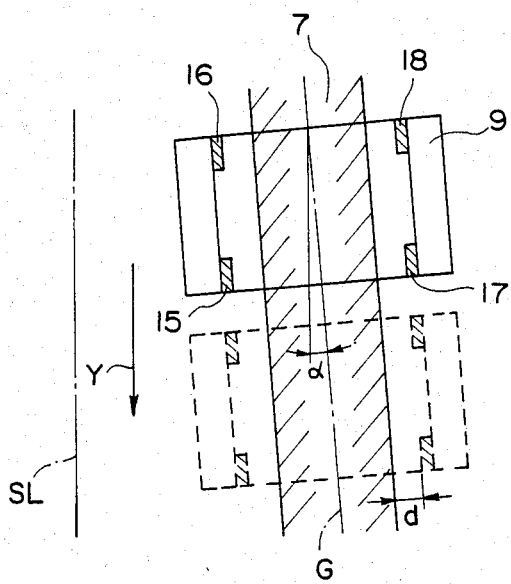
FIGS. 7 and 8 are views for illustrating the operation of compensating for the right angle.

In FIG. 7, SL is a scanning line determined in design. When the mask and wafer are moved parallel to this line, proper transfer is effected. However, if the guide line G of the guide rail 7 is inclined by $\alpha°$ due to a minute mounting error or aging of the guide rail 7, it will be displaced by L tan $\alpha°$ with the amount of movement L of the air bearing. Where the projection system is of the reflecting optical type shown in FIG. 1, the image is inverted when the image of the photomask is transferred to the wafer and therefore, the photomask and the wafer are deviated by 2L tan $\alpha°$ relative to each other when the air bearing is moved by L tan $\alpha°$ in the X direction.

If, as shown in FIG. 7, the pads 15–18 are uniformly spaced apart from the side surface of the guide rail 7 by an interval d, the air bearing is moved while being inclined by $\alpha°$ with respect to the scanning line SL and thus, an error of right angle is added to the projected image on the wafer.

Since the inclination of the guide line G with respect to the scanning line SL can be measured in advance, the amount of correction in the X direction resulting from the amount of movement of the air bearing in X direction is determined. Accordingly, with the movement of the air bearing, the air pressures supplied to the pads 15 and 16 may be linearly increased and the air pressures supplied to the pads 17 and 18 may be linearly decreased. With this, the movement line G' as a result becomes parallel to the scanning line SL.

Figure 8:
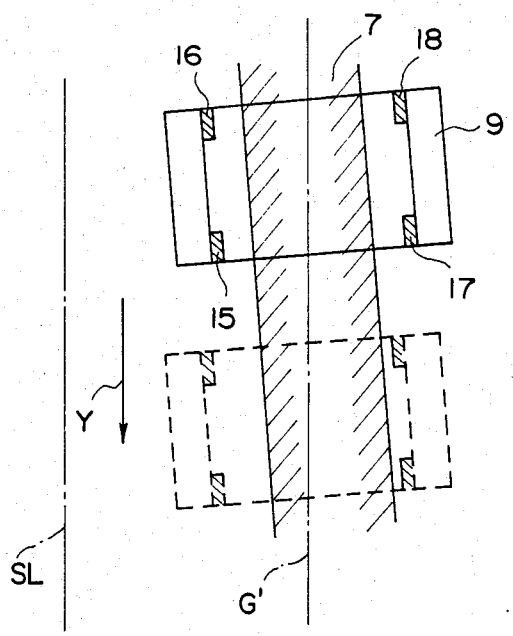
Figure 9:
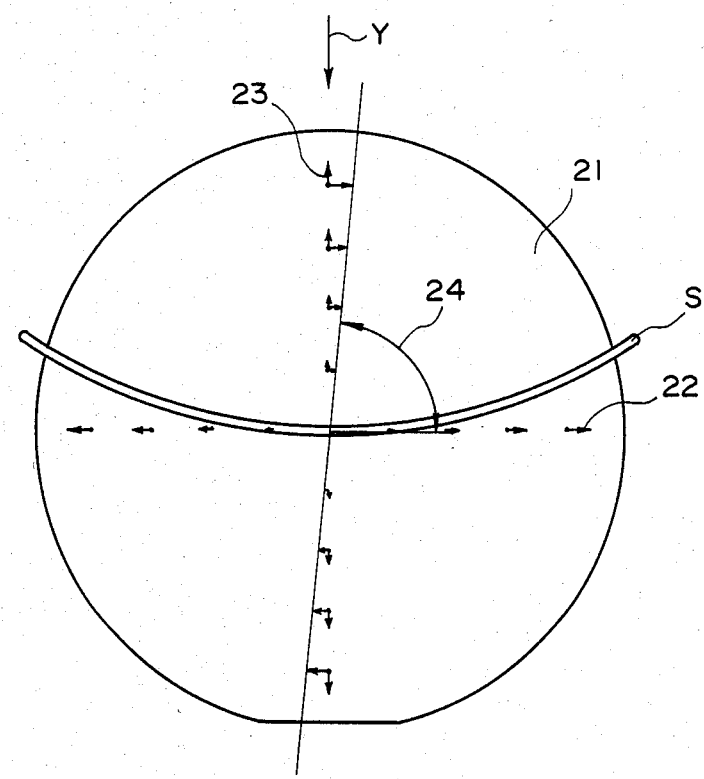
FIG. 9 illustrates the distortion of the image on a wafer.
Figure 10:
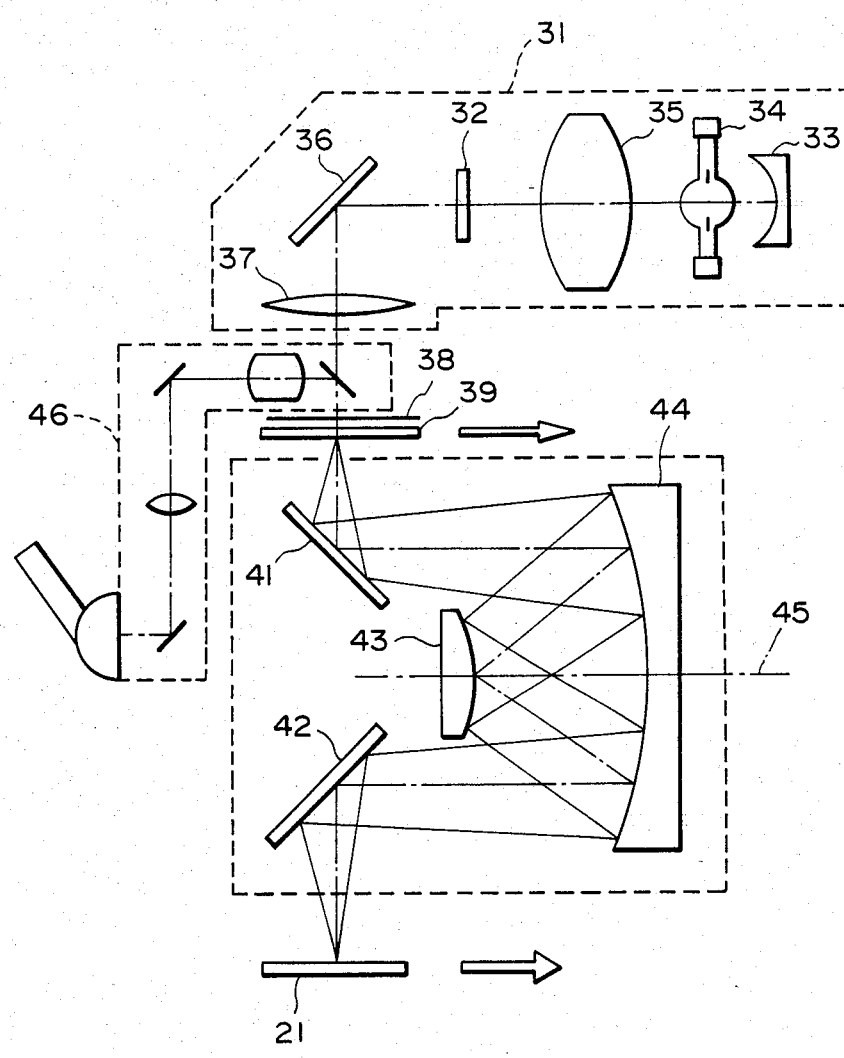
FIG. 10 shows a projection optical system.

Also, if the guide rail is inclined conversely to that shown in FIG. 8 with respect to the scanning line, with the movement of the air bearing, the air pressures supplied to the pads 15 and 16 may be linearly decreased and the air pressures supplied to the pads 17 and 18 may be linearly increased. By the above-described control, the optical axis and the movement axis can be made parallel to each other and the right angle error can be corrected.

While description has been made with respect to the pads floating up due to the air pressure, the pads may also be ones floating up due to magnetic force.

What is claimed is:

1. A projection exposure apparatus comprising:
   negative holding means for holding a negative;
   photosensitive member holding means for holding a photosensitive member;
   a projection optical system for projecting an image of the negative upon the photosensitive member;
   movable means for coupling said negative holding means and said photosensitive member holding means;
   guide means for guiding said movable means in a scanning direction;
   first compensating means for compensating for distortion of the image of the negative by said projection optical system by controlling the temperature of at least one of the negative and the photosensitive member; and
   second compensating means for compensating for inclination of the posture of said movable means during the movement thereof and for compensating for distortion of the image of the negative on the photosensitive member.

2. A projection exposure apparatus according to claim 1, wherein said first compensating means comprises a heater.

3. A projection exposure apparatus according to claim 1, wherein said first compensating means comprises a Peltier element group.

4. A projection exposure apparatus according to claim 1, wherein said guide means has a guide path and a fluid bearing engaged therewith, and said second compensating means comprises a controller for controlling a fluid pressure to be supplied to said fluid bearing.

5. A projection exposure apparatus according to claim 1, wherein said projection optical system comprises a one-to-one magnification reflecting optical system.

6. A projection exposure apparatus comprising:
   negative holding means for holding a negative;
   photosensitive member holding means for holding a photosensitive member;
   a projection optical system for projecting the image of the negative upon the photosensitive member;
   means for moving said photosensitive member holding means relative to said projection optical system; and
   temperature control means for producing a predetermined temperature distribution in the photosensitive member to compensate for distortion of the image of the negative by the projection optical system.

7. A projection exposure apparatus according to claim 7, further comprising image limiting means for limiting the image of the negative on the photosensitive member along the direction of movement.

8. A projection exposure apparatus comprising:
   a mask holder for holding a mask;
   a wafer holder for holding a wafer;
   a projection optical system for projecting the image of the mask upon the wafer;
   a guide path extending along a scanning direction;
   a plurality of sliders sliding on said guide path;
   a movable member coupling said mask holder and said wafer holder and placed on said sliders;
   a heater for compensating for magnification error of the image in a direction orthogonal to the scanning direction attributable to said projection optical system and for producing a temperature distribution in one of the mask and the wafer; and
   a controller for compensating for magnification error of the image in the scanning direction and for controlling the posture of said movable member during the movement thereof.

* * * * *